US012578658B2

(12) United States Patent
Van Damme et al.

(10) Patent No.: US 12,578,658 B2
(45) Date of Patent: Mar. 17, 2026

(54) SYSTEMS, METHODS, AND DEVICES FOR THERMAL CONDITIONING OF RETICLES IN LITHOGRAPHIC APPARATUSES

(71) Applicants: ASML Netherlands B.V., Veldhoven (NL); ASML Holding N.V., Veldhoven (NL)

(72) Inventors: Jean-Philippe Xavier Van Damme, Wezembeek-Oppem (BE); Richard John Johnson, Redding, CT (US); Raaja Ganapathy Subramanian, Maarheeze (NL)

(73) Assignee: ASML Netherlands B.V., Veldhoven (NL)

( * ) Notice: Subject to any disclaimer, the term of this patent is extended or adjusted under 35 U.S.C. 154(b) by 111 days.

(21) Appl. No.: 18/573,025

(22) PCT Filed: Jun. 13, 2022

(86) PCT No.: PCT/EP2022/066044
§ 371 (c)(1),
(2) Date: Dec. 21, 2023

(87) PCT Pub. No.: WO2022/268560
PCT Pub. Date: Dec. 29, 2022

(65) Prior Publication Data
US 2024/0295832 A1      Sep. 5, 2024

Related U.S. Application Data

(60) Provisional application No. 63/213,898, filed on Jun. 23, 2021.

(51) Int. Cl.
*G03F 7/20*          (2006.01)
*G03F 7/00*          (2006.01)

(52) U.S. Cl.
CPC ...... *G03F 7/70858* (2013.01); *G03F 7/70508* (2013.01); *G03F 7/70533* (2013.01)

(58) Field of Classification Search
CPC ............. G03F 7/70858; G03F 7/70508; G03F 7/70533; G03F 7/70783; G03F 7/7085; G03F 7/70875
See application file for complete search history.

(56) References Cited

U.S. PATENT DOCUMENTS 5,610,965 A      3/1997  Mori et al.
9,983,489 B2    5/2018  Berendsen et al.
(Continued)

FOREIGN PATENT DOCUMENTS

JP      S58-159329 A      9/1983
JP      2006-078673 A    3/2006
(Continued)

OTHER PUBLICATIONS

International Search Report and Written Opinion of the International Searching Authority directed to International Patent Application No. PCT/EP2022/066044, mailed Oct. 25, 2022; 12 pages.
(Continued)

*Primary Examiner* — Mesfin T Asfaw
(74) *Attorney, Agent, or Firm* — Finnegan, Henderson, Farabow, Garrett & Dunner, LLP

(57) ABSTRACT

Embodiments herein describe systems, methods, and devices for thermal conditioning of patterning devices at a litho-graphic apparatus. A patterning device cooling system for thermally conditioning a patterning device (202) of a lithographic apparatus is described, the cooling system including a thermal conditioner that thermally conditions the patterning device, and a controller that controls the thermal conditioner to determine a temperature state of the patterning device, determine a production state of the litho-graphic (Continued)

apparatus, and thermally condition the patterning device for exposures based on the temperature state and a production state of the lithographic apparatus.

13 Claims, 8 Drawing Sheets

(56) References Cited

U.S. PATENT DOCUMENTS

| | | |
|---|---|---|
| 2004/0109152 A1 | 6/2004 | Hirayanagai |
| 2006/0256305 A1 | 11/2006 | Won |
| 2015/0241796 A1* | 8/2015 | Ebert, Jr. ............ G03F 7/70716 |
| | | 355/30 |
| 2017/0115578 A1 | 4/2017 | Berendsen et al. |
| 2019/0101837 A1 | 4/2019 | Cekli et al. |
| 2021/0033987 A1 | 2/2021 | Yang et al. |

FOREIGN PATENT DOCUMENTS

| | | |
|---|---|---|
| TW | 2015-46568 A | 12/2015 |
| TW | 2019-44179 A | 11/2019 |
| WO | WO 2020/094369 A1 | 5/2020 |

OTHER PUBLICATIONS

International Preliminary Report on Patentability directed to International Patent Application No. PCT/EP2022/066044, issued Dec. 14, 2023; 8 pages.
"Systems, Methods, and Devices for Thermal Conditioning of Reticles in Lithographic Apparatuses," Research Disclosure No. 688044, vol. 688, No. 44, Aug. 1, 2021; 30 pages.

* cited by examiner

700

Determine a temperature state of a patterning device —— 702

Determine a production state of a lithographic apparatus —— 704

Condition the patterning device based on the temperature state and the production state —— 706

SYSTEMS, METHODS, AND DEVICES FOR THERMAL CONDITIONING OF RETICLES IN LITHOGRAPHIC APPARATUSES

CROSS-REFERENCE TO RELATED APPLICATIONS

This application claims priority of U.S. Provisional Patent Application No. 63/213,898, which was filed on Jun. 23, 2021, and which is incorporated herein in its entirety by reference.

FIELD

The present disclosure relates to systems, methods, and devices for thermal conditioning and reticle cooling in lithographic apparatuses.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

To project a pattern on a substrate a lithographic apparatus may use electromagnetic radiation. The wavelength of this radiation determines the minimum size of features which can be formed on the substrate. A lithographic apparatus may use extreme ultraviolet (EUV) radiation, having a wavelength within the range 4-20 nm, for example 6.7 nm or 13.5 nm, or deep ultraviolet (DUV) radiation, having a wavelength in the range of about 120 to about 400 nm, for example 193 or 248 nm.

In DUV lithography, the radiation beam may cause thermal responses in the reticle. In particular, the reticle may absorb a large amount of thermal energy from the DUV radiation beam, which can cause the reticle to heat up and expand. Other sources, such as various mechatronic devices throughout the reticle handler and reticle stage modules, can contribute to reticle heating as well. Reticle heating, which results in a non-uniform thermal profile of the reticle, may serve as a major contribution to image distortion and overlay errors in the lithography system. Thus, reticle cooling methods can be utilized to prevent deformation and overlay issues. In some cases, thermal conditioning systems that utilize customized nozzles and gas outlets may be implemented in patterning apparatuses for providing a gas flow near to the surface of a reticle and support structure for reticle cooling. However, such systems and methods for cooling and controlling reticle temperatures may necessitate customized parts and additional hardware that result high costs and increased system complexity.

SUMMARY

Accordingly, there may be a need for low cost solutions with reduced complexities for reticle cooling and thermal conditioning in DUV lithography. Thus, the present disclosure provides systems, methods, and devices for thermal conditioning of reticles at a patterning device handling apparatus and a support structure in lithographic apparatuses.

In some embodiments, a patterning device cooling system for thermally conditioning a patterning device of a lithographic apparatus is described. The cooling system includes a thermal conditioner configured to thermally condition the patterning device. The cooling system also includes a controller that controls the thermal conditioner to determine a temperature state of the patterning device, determine a production state of the lithographic apparatus, and thermally condition the patterning device for exposures based on the temperature state and the production state.

In some embodiments, a method for thermally conditioning a patterning device of a lithographic apparatus is described. The method includes determining a temperature state of a patterning device, determining a production state of the lithographic apparatus, and thermally conditioning, by a conditioning device, the patterning device for exposures based on the temperature state and the production state.

Further features of the disclosure, as well as the structure and operation of various embodiments of the disclosure, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

Figure 1A:
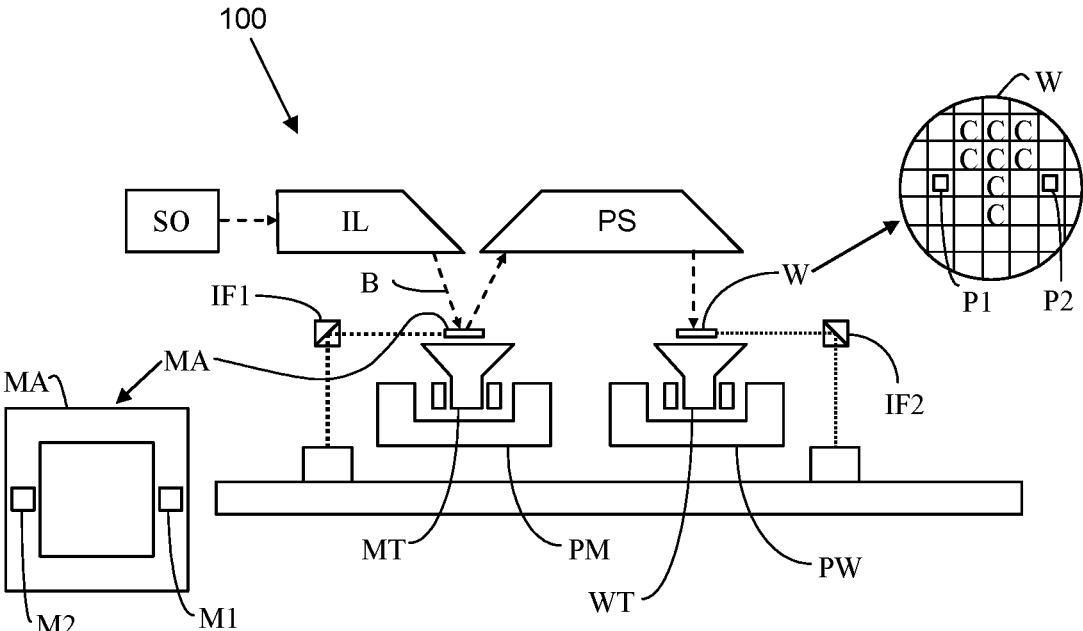
FIG. 1A is a schematic illustration of a reflective lithographic apparatus, according to embodiments of the present disclosure.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic Systems

Figure 1B:
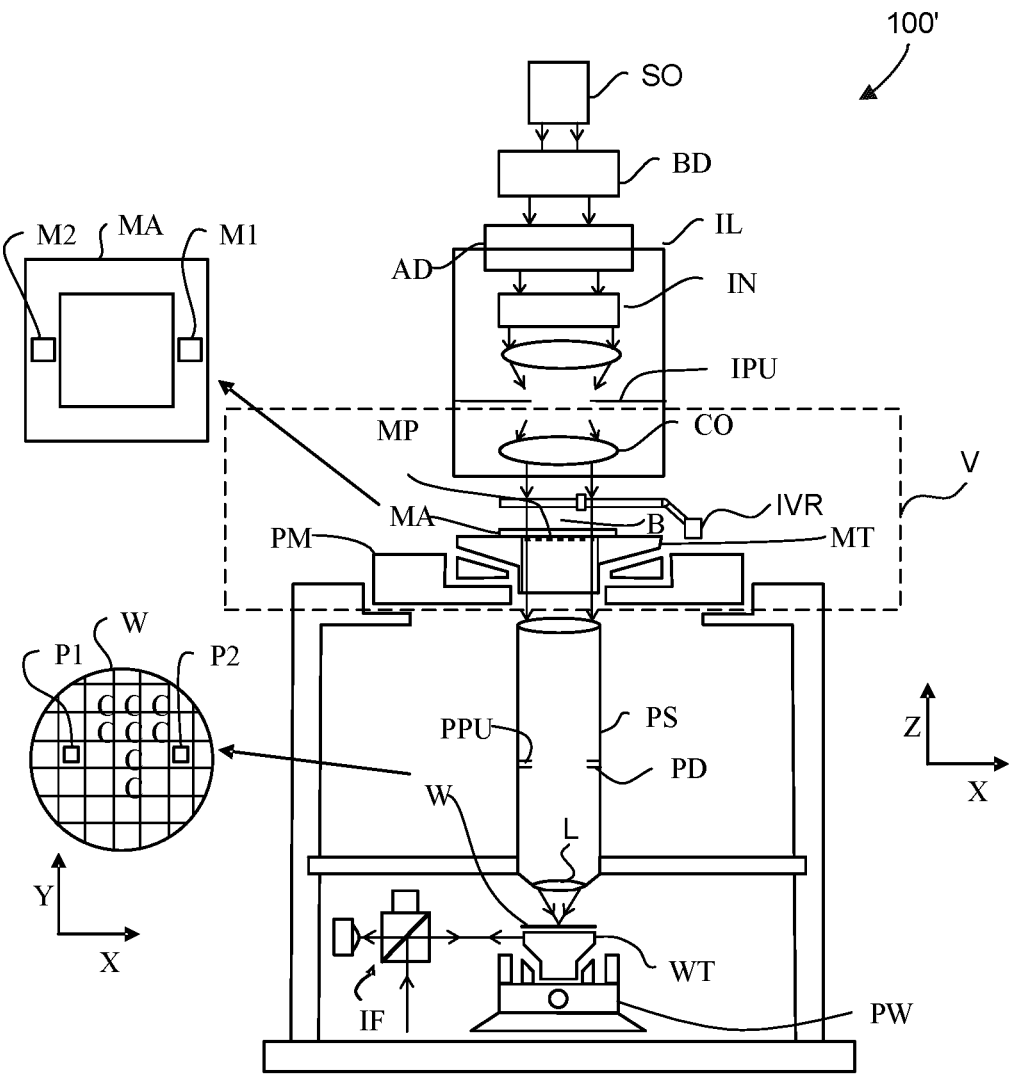
FIG. 1B is a schematic illustration of a transmissive lithographic apparatus, according to embodiments of the present disclosure.

FIGS. 1A and 1B are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (e.g., deep ultra violet (DUV) radiation beam or an extreme ultra violet (EUV) radiation beam); a support structure (e.g., a mask table) MT configured to support a patterning device (e.g., a mask, a reticle, or a dynamic patterning device) MA and connected to a first positioner PM configured to accurately position the patterning device MA; and, a substrate table (e.g., a wafer table) WT configured to hold a substrate (e.g., a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (e.g., comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, e.g., which can be fixed or movable, as required. By using sensors, the support structure MT can ensure that the patterning device MA is at a desired position, e.g., with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some aspects, the additional table may not be a substrate table WT.

Referring to FIGS. 1A and 1B, the illuminator IL receives a radiation beam B from a radiation source SO. The source SO and the lithographic apparatus 100, 100' can be separate physical entities, e.g., when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, e.g., suitable directing mirrors and/or a beam expander. In other cases, the source SO can be an integral part of the lithographic apparatus 100, 100', e.g., when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, in operation, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder, or capacitive sensor), the substrate table WT can be moved accurately (e.g., so as to position different target portions C in the path of the radiation beam B). Similarly, the first positioner PM and another position sensor IF1 can be used to accurately position the patterning device (e.g., mask) MA with respect to the path of the radiation beam B. Patterning device (e.g., mask) MA and substrate W can be aligned using mask alignment marks M1, M2 and substrate alignment marks P1, P2.

Referring to FIG. 1B, the radiation beam B is incident on the patterning device (e.g., mask MA), which is held on the support structure MT (e.g., mask table), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

With the aid of the second positioner PW and position sensor IF (e.g., an interferometric device, linear encoder, or capacitive sensor), the substrate table WT can be moved accurately (e.g., so as to position different target portions C in the path of the radiation beam B). Similarly, the first positioner PM and another position sensor (not shown in FIG. 1B) can be used to accurately position the mask MA with respect to the path of the radiation beam B (e.g., after mechanical retrieval from a mask library or during a scan).

In general, movement of the support structure MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the support structure MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Support structure MT and patterning device MA can be in a vacuum chamber V, where an in-vacuum robot IVR can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT can be determined by the (de-) magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100′ includes a deep ultra violet (DUV) source, which is configured to generate a beam of DUV radiation for DUV lithography. In general, the DUV source is configured in a radiation system, and a corresponding illumination system is configured to condition the DUV radiation beam of the DUV source.

Exemplary Embodiments of Reticle Handling Apparatus

Some lithographic apparatuses include a patterning device handling apparatus that exchanges the patterning devices. To load the patterning device on a patterning device support of the lithographic apparatus, a gripping device of the patterning device handling apparatus couples with the patterning device, for example, by using vacuum suction. Then, the patterning device handling apparatus moves the patterning device (for example, by rotating about a turret) towards the patterning device support to load the patterning device.

Figure 2:
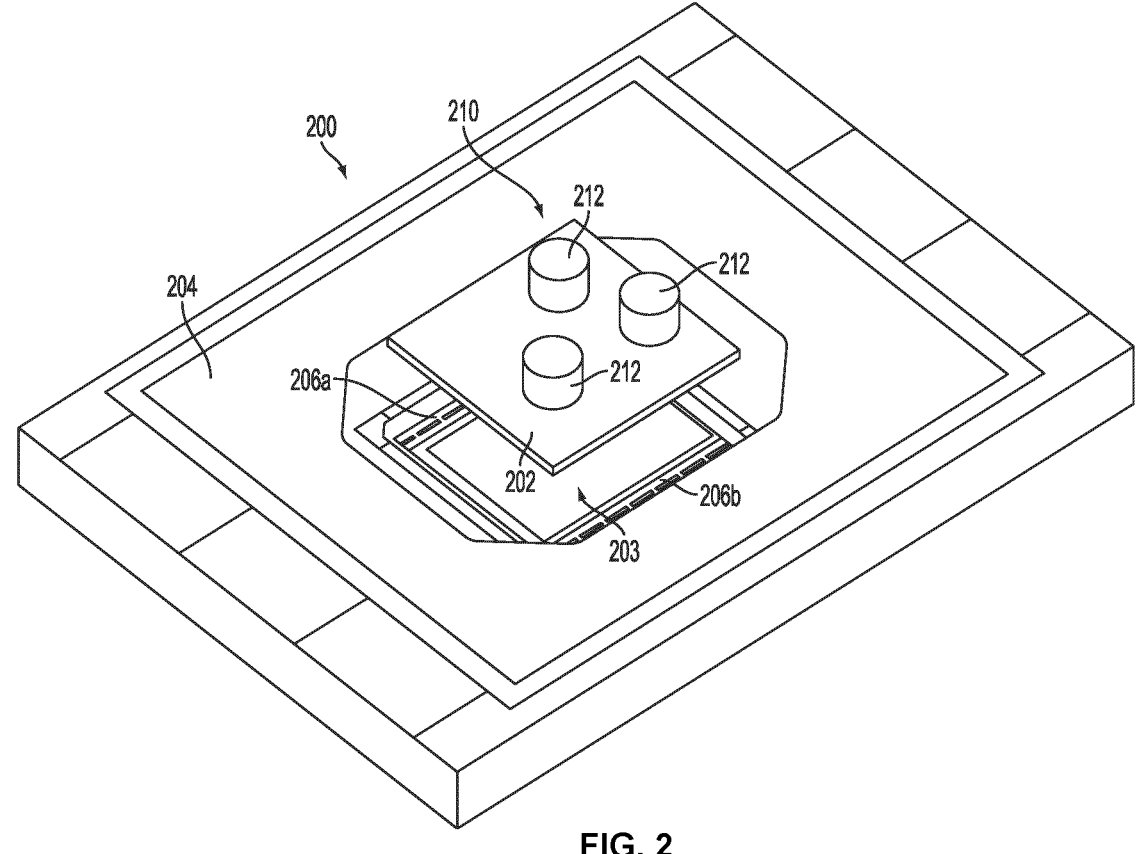
FIG. 2 depicts a perspective view of a patterning device support and a gripping device of a patterning device handling apparatus coupled with a patterning device, according to embodiments of the present disclosure.

FIG. 2 depicts a perspective view of an object support 200 and a gripping device 210 of an object handling apparatus coupled with a patterning device 202, according to embodiments of the present disclosure. In some embodiments, patterning device 202 can be a patterning device for use in a lithographic apparatus, for example, a mask or reticle, or a substrate (for example, a wafer) for use with a lithographic apparatus. In some embodiments, object support 200 can be a patterning device support, a mask table or a reticle stage, or can be a substrate support, for example, a wafer table. In some embodiments, gripping device 210 can comprise a robot arm that uses vacuum suction to pick up and position a reticle in a reticle stage area of object support 200. Gripping device 210 can comprise one or more vacuum units 212 that generate the vacuum suction to couple the reticle to the object handling apparatus.

In some embodiments, patterning device support 200 can include a patterning area 203 (e.g., a reticle area) where patterning device 202 can be positioned. In some embodiments, patterning device support 200 can include a moveable component 204 configured to move patterning device

Figure 3:
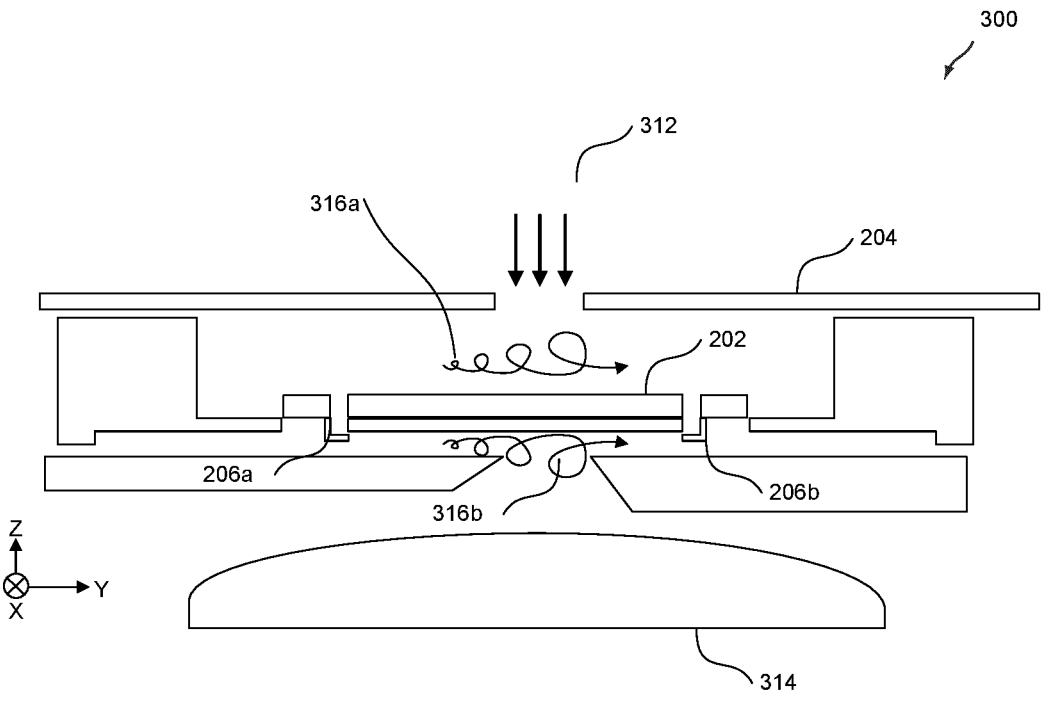
FIG. 3 depicts a perspective view of the patterning device support of FIG. 2 illustrating impacts of patterning device temperature offset, according to embodiments of the present disclosure.

202, for example, translation along a plane or out of the plane. For example, as illustrated in FIGS. 2 and 3, patterning device 202 can translate along a plane defined by the x-axis and the y-axis (the X-Y plane). Movable component 204 can be movable relative to a second component (not shown) along a plane substantially parallel to the plane in which patterning device 202 translates. In some embodiments, the second component is movable relative to a reference, for example, a frame or balance mass (not shown).

In some embodiments, movable component 204 is a short-stroke component, and the second component (not shown) is a long-stroke component. A long stroke actuator (not shown) moves the second movable component with respect to the reference. One or more short stroke actuators (not shown) can move movable component 204 with respect to the second movable component. Typically, the short stroke actuators position movable component 204 relative to the second movable component with a relatively high accuracy. The short stroke actuators have a limited working range. Typically, the long stroke actuator has a large working range, for example, the whole working space of patterning device support 200. The long stroke actuator positions the second movable component with a relatively low accuracy. In operation, the long stroke actuator and the second movable component move patterning device 202 to a position within a workable range of the short stroke actuators that includes a desired position of patterning device 202. Then the short stroke actuators and movable component 204 move patterning device 202 to the desired position. In some embodiments, first movable component 204 and the second component can have any suitable shape.

In some embodiments, patterning device support 200 can include one or more clamping interfaces configured to selectively and securely couple patterning device 202 to moveable component 204. As shown in FIG. 2, for example, patterning device support 200 can include a first clamping interface 206a and a second clamping interface 206b. Each clamping interface 206a and 206b can be configured to selectively and substantially couple with patterning device 202 to prevent movement of patterning device 202 relative to moveable component 204.

In some embodiments, clamping interfaces 206a and 206b can comprise vacuum pads. In some embodiments, the vacuum pads of clamping interfaces 206a and 206b can be configured such that the vacuum force generated by one of clamping interfaces 206a or 206b is selectively reduced or set equal to about atmospheric pressure while the vacuum force generated by the other clamping interface 206a or 206b is maintained above atmospheric pressure.

In some embodiments, each clamping interface, for example, clamping interfaces 206a and 206b, can be in fluid communication with a vacuum generator, for example, any suitable device capable of creating a negative pressure at each clamping interface. In some embodiments, clamping interfaces 206a and 206b can be membranes that create, for example, a leaking vacuum seal that securely couples patterning device 202 to moveable component 204. In such membrane embodiments, clamping interfaces 206a and 206b can comprise one or more openings for allowing fluid flow there through to create a vacuum force that pulls patterning device 202 against clamping interfaces 206a and 206b, coupling patterning device 202 to moveable component 204. The vacuum force generates friction between patterning device 202 and clamping interfaces 206a and 206b. This friction can prevent internal stresses of patterning device 202 from being either partially or fully relieved after gripping device 210 releases patterning device 202.

In some embodiments, patterning device 202 is transferred or exchanged from a gripping device 210 of a patterning device handling apparatus (not shown in FIG. 2) to patterning device support 200 and coupled to movable component 204 for operational use. In some embodiments, the patterning device handling apparatus is a turret-type handling apparatus.

In some embodiments, gripping device 210 couples patterning device 202 to a patterning device handling apparatus (not shown) as the device handling apparatus moves patterning device 202 close to patterning device support 200. The patterning device 202 can be arranged at a distance from surfaces of clamping interfaces 206a and 206b of patterning device support 200. In some embodiments, patterning device 202 can be uncoupled from gripping device 210. For example, a vacuum generated by vacuum units 212 of gripping device 210 can be fully released to uncouple patterning device 202, and gripping device 210 can be moved out of contact with patterning device 202.

Patterning device 202 can be selectively and securely coupled to patterning device support 200. For example, clamping interfaces 206a and 206b can be activated, for example, by creating a vacuum that couples patterning device 202 to movable component 204 of patterning device support 200, substantially preventing movement of patterning device 202 relative to movable component 204.

It can be appreciated that the patterning device may be caused to heat up and expand during radiation (e.g., DUV radiation and/or EUV radiation). Such heating and expansion of the patterning device may cause deformities that ultimately result in overlay errors. FIG. 3 depicts a perspective view of the patterning device support of FIG. 2 illustrating impacts of patterning device temperature offset, according to embodiments of the present disclosure. According to some embodiments, patterning device support 300 can include patterning device 202, clamping interfaces 206a and 206b, and movable component 204. According to some embodiments, patterning device 202 can be exposed to light (e.g. irradiated with DUV or EUV light 312) thereby increasing the temperature of the patterning device 202 as well as ambient temperature around it 316a and 316b. It can be appreciated that ambient temperature changes can be attributed to the exposure of the patterning device 202 when patterning device 202 and lens 314 are irradiated by DUV or EUV light 312. According to some embodiments, temperature changes of the patterning device 202 can impact overlay and reduce accuracy. These can include local changes in the refractive index of the air surrounding the patterning device 202, thereby distorting the exposed image. Also, these may include physical distortions of the patterning device 202, causing non-uniform thermal profile and causing distortions and overlay errors.

Figure 4:
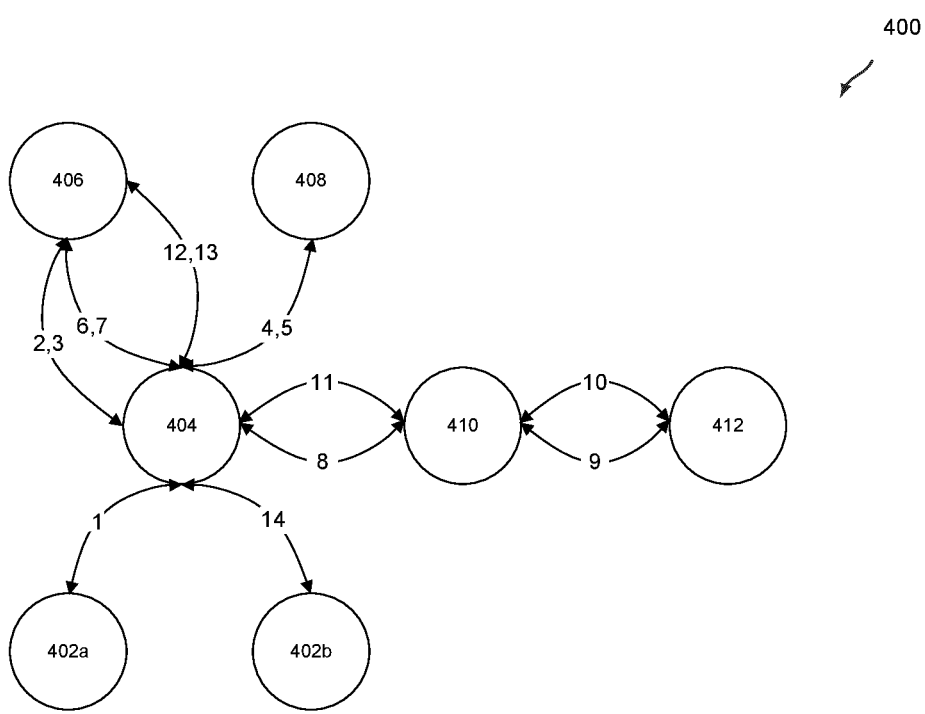
FIG. 4 illustrates a patterning device load sequence and sources of temperature offsets, according to embodiments of the present disclosure.

FIG. 4 illustrates a patterning device load sequence and sources of temperature offsets, according to embodiments of the present disclosure. According to some embodiments, FIG. 4 illustrates load sequences 400 between components within a lithographic apparatus. Such components may include loading ports 402a and 402b, transfer robot 404, conditioning device 406, inspection apparatus 408, transfer turret 410, and reticle stage 412. According to some examples, the lithographic apparatus and/or a controller of lithographic apparatus may perform the following sequence. It can be appreciated that the following load/conditioning sequence is but one non-limiting example and other sequences may also be performed.

According to some embodiments, the lithographic apparatus may detect the presence of a patterning device in load port 402a. The detection may be of a single patterning device or a plurality of patterning devices in one or more pods. According to one example, transfer robot 404 can be configured to transport the patterning device to/from load ports 402a/402b (steps 1 and 14), to/from conditioning device 406 (steps 2, 3, 6, 7, 12, 13), to/from inspection apparatus 408 (steps 4, 5), and to/from transfer turret 410 (steps 8, 11). According to some embodiments, transfer turret 410 may be part of transfer robot 404. According to some embodiments, a load sequence may proceed as follows: patterning device 202 can be transferred to conditioning device 406 as an initial step. This enables the lithographic apparatus to set a conditioning base line as the initial condition of the patterning device may not be initially known. Thereafter, the patterning device 202 can be transferred to inspection apparatus 408 for inspection prior to pattering exposure. It can be appreciated that the temperature of the patterning device can be subject to change due to the transfer and inspection. For example, transfer robot 404 can cause the patterning device temperature to increase during transfer, and similarly, inspection apparatus 408 may cause the patterning device temperature to increase due to the inspection operation. According to one embodiment, transfer robot 404 can be configured to return patterning device 202 to conditioning apparatus 406 to condition the patterning device (e.g., cool the patterning device) to a desired temperature. It can be appreciated that desired temperatures may vary depending on the composition of the patterning device. According to some embodiments, a desired nominal temperature for the patterning device may be approximately 22° C. It can be appreciated that a desired/nominal temperature may range and depend on factors relating to the patterning device itself (e.g., material composition, etc.). Conditioning operations will be further described with regard to FIG. 5 below.

According to some embodiments, transfer robot 404 can be configured to transfer a conditioned patterning device (e.g., patterning device 202) to and from reticle stage 412 for patterning exposure (e.g., steps 8, 9, 10, 11). After exposure, the patterning device 202 can be returned to conditioning device 406 for further conditioning.

According to some embodiments, conditioning device 406 may prioritize the conditioning operations based on a condition state of the patterning device, the load sequence of the lithographic apparatus, and a production state of the lithographic apparatus. According to some embodiments, the condition state of the patterning device may include a not conditioned state, a passive conditioning state, an active conditioning state, a conditioned state and an unconditioning state. According to some embodiments, a passive conditioning state is a state of the patterning device where it is currently in a passive conditioning slot of the conditioning device. According to some embodiments, an active conditioning state is a state where the patterning device is in an active conditioning slot of the conditioning device. According to some embodiments, a conditioned state is a state in which the patterning device is deemed to be at the desired optimal temperature. According to some embodiments, this may be a state of the patterning device as it is transitioning from active to passive slots, or as it is transitioning out of the conditioning device. According to some embodiments, an unconditioning state may be a transition state between a conditioned state and an unconditioned state where the patterning device temperature is increasing. According to some embodiments, the load sequence may include the load sequences described in FIG. 4 herein, which indicate where the patterning device is and where the patterning device may be transferred to. For example, the load sequence may reflect that the patterning device is being transferred from an inspection operation or a patterning operation. Such operations may include different exposure times and as a result, may have different conditioning requirements. According to some embodiments, the production state of the lithographic apparatus may include an overlay focused state (e.g., slower throughput that prioritizes conditioning) or productivity focused state (e.g., faster throughput that prioritizes productivity). It can be appreciated that the production state may also include a variable state where different priorities are determined based on operator preferences, the type of exposure and duration based on the recipe and the like. Accordingly, such production state may be referred to as a recipe dependent production state where priorities may change based additional factors. It can be appreciated that the recipe dependent production state may help determine whether a patterning device is conditioned first or processed with scanning/patterning operations first.

Figure 5:
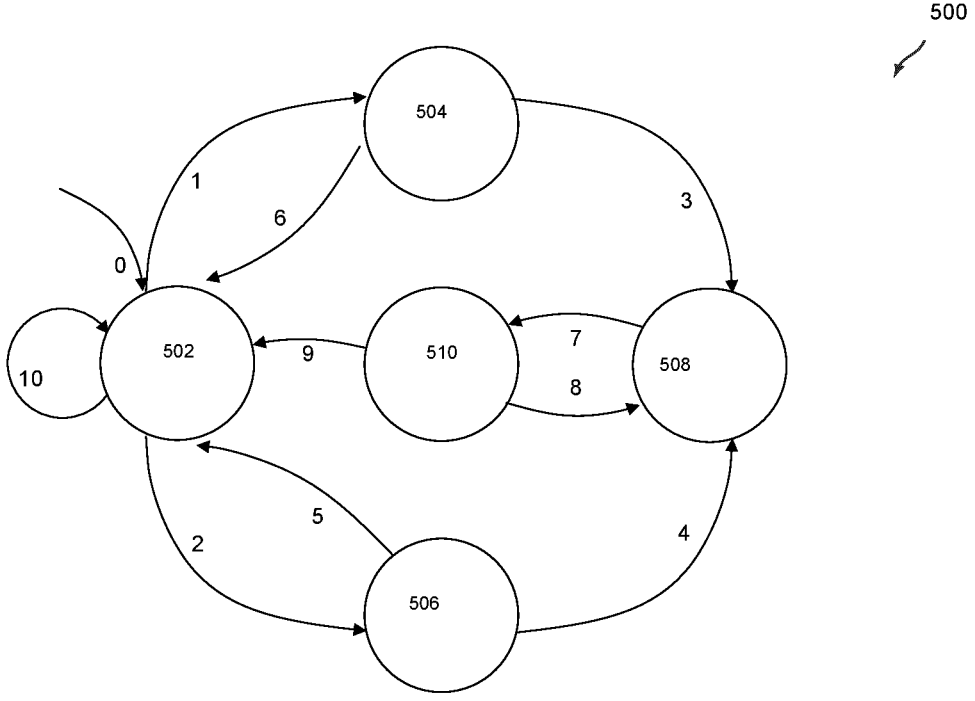
FIG. 5 illustrates a patterning device conditioning state model, according to embodiments of the present disclosure.

FIG. 5 illustrates a patterning device conditioning state model 500, according to embodiments of the present disclosure. According to some embodiments, the patterning device conditioning states may be (but not limited to) a not conditioned state 502, an active conditioning state 504, a passive conditioning state 506, a conditioned state 508, and an unconditioning state 510. According to some embodiments, an initial state of a patterning device may be set as a not conditioned state 502 when the patterning device is first received at the lithographic apparatus for example. According to some embodiments, depending on the use and operational state of the lithographic apparatus, the patterning device may either be transferred to a passive conditioning slot within conditioning device 406 or an active conditioning slot within conditioning device 406. According to some embodiments, a patterning device may be transferred to a passive conditioning slot within conditioning device 406 (e.g., step 2) when the patterning device temperature is determined to be within an acceptable threshold within the nominal temperature or if it is determined that the pattering device will not have an immediate use. According to some embodiments, a patterning device may be transferred to an active conditioning slot within conditioning device 406 (e.g., step 1) when the patterning device is initially received (e.g., as a default measure) for example. According to some embodiments, a patterning device may be transferred to an active conditioning slot within conditioning device 406 when the patterning device temperature is determined not to be within an acceptable threshold within the nominal temperature or if it is determined that the pattering device will have an immediate use.

According to some embodiments, conditioning device 406 may continuously track conditioning time of the patterning device under any and all of the conditioning states. For example, an active conditioning state provides a more intensive conditioning operation (e.g., through fluid and air circulation cooling methods). Such intensive conditioning state may not be required after a preset time interval. In one example, the patterning device may be transferred from an active conditioning slot to a passive conditioning slot after the preset time has lapsed (e.g., a <5 minute, <10 minute, <n-minute interval is tracked by conditioning device 406). It can be appreciated that passive conditioning slot may be configured to maintain a conditioning/conditioned state of the patterning device by providing an environment with a constant, nominal temperature. According to some embodiments, when an active conditioning time out event is detected, or a passive conditioning time out event is detected (e.g., the conditioning device 406 determines that the preset time is met for a conditioned state), the patterning device is either transferred from active to passive conditioning slot, or remains in the passive conditioning slot as described herein (e.g., steps 3 and 4).

According to some embodiments, the patterning device state may be changed from conditioned state to unconditioning state 510 when the patterning device is picked up for transfer. If the patterning device is picked up for transfer to another slot, then the patterning device is returned to conditioned state once the patterning device is placed in that slot (e.g., transfer from active to passive slot-steps 7 and 8). According to some embodiments, if the transfer operation (by robot 404 or turret 410) is outside of the conditioning device (e.g., for inspection or patterning), the conditioning state of the patterning device is returned to a not conditioned state 502. This change in state between unconditioning state 510 and not conditioned state 502 can be done immediately, or may be done based on a pre-set time. For example, if a device stays in an unconditioning state 510 for more than the pre-set time, then the device conditioning state is changed to not conditioned state 502.

Figure 6:
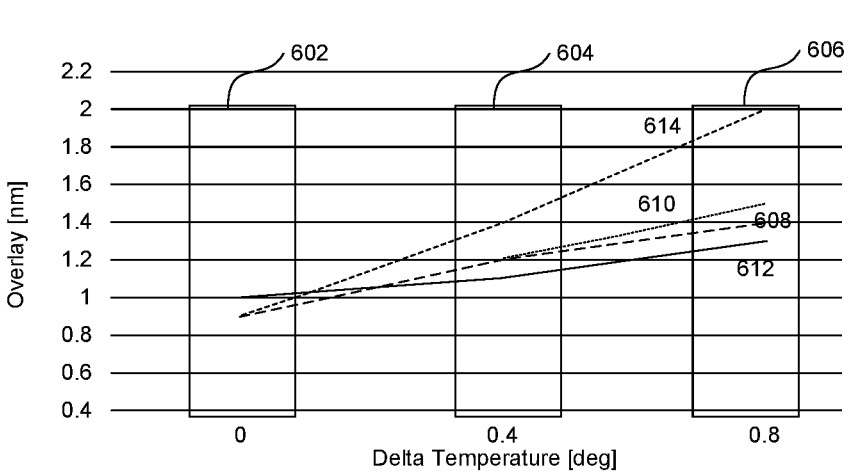
FIG. 6 illustrates sensitivity levels to hot incoming patterning devices, according to embodiments of the present disclosure.

FIG. 6 illustrates sensitivity levels 600 to hot incoming patterning devices, according to embodiments of the present disclosure. According to some embodiments, the sensitivity chart illustrates a nominal temperature patterning device 602, a warm patterning device 604, and a hot patterning device 606. As can be illustrated, overlay is minimized when the patterning device is nominal and the overlay increases as the patterning device deviates from nominal. According to some embodiments, overlay sensitives are exponentially increased when the patterning device is hot. It can be appreciated that the changes in temperature described in the figure are illustrative, and other temperature deltas may be set when determining warm, and hot patterning devices. According to some embodiments, the exponential level of sensitivity may be a result of changes in the refractive index of the patterning device as well as expansion of the patterning device. It can be appreciated that such expansion provides certain pressures on the patterning device at certain points (e.g., clamping interfaces 206a and 206b). According to some embodiments, plots 608, 610, 612, and 614 represent different sensitivity responses for the patterning device based on different thermal models tracking distortion metrics of the patterning device during a scanning/illumination operation. It can be appreciated that the models illustrate the overarching point that temperature increases of the patterning device increase overlay error. According to some embodiments, the error may be exponentially increased due to thermal expansion and changes in the refractive properties of the patterning device (e.g., 614).

Figure 7:
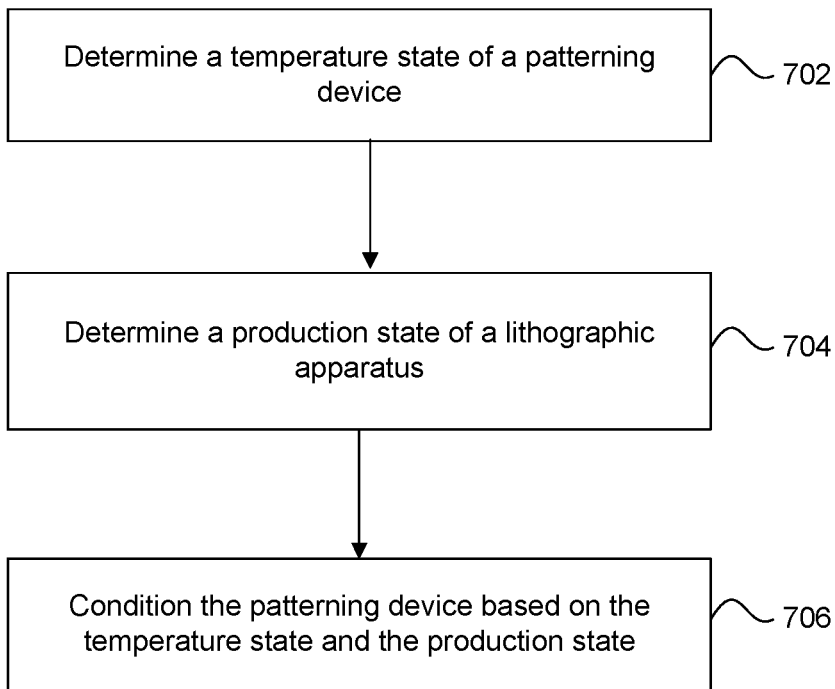
FIG. 7 is a flowchart of an exemplary method for providing thermal conditioning of a patterning device, according to embodiments of the present disclosure.

FIG. 7 is a flowchart of an exemplary method for providing thermal conditioning of a patterning device, according to embodiments of the present disclosure. According to some embodiments, there is provided a patterning device cooling system for thermally conditioning a patterning device of a lithographic apparatus, the cooling system may include a thermal conditioner (e.g., conditioning device 406) that thermally conditions the patterning device and a controller that controls the thermal conditioner to perform the conditioning method. According to some embodiments, the controller can determine a temperature state of the patterning device as shown in step 702. As described herein, a temperature state may be the temperature of the patterning device. This may be determined based on a model run by the controller to estimate the temperature of the patterning device based on tracked operations performed on the patterning device. Additionally or in the alternative, the temperature may be measured by a detector. According to some embodiments, the controller of the patterning device cooling system may be configured to transmit data indicative of the temperature state of a pattering device (e.g., a patterning device load temperature) to the lithographic apparatus (e.g., a controller of the lithographic apparatus). The controller of the lithographic apparatus may be configured to determine a distortion of the patterning device based on the data indicative of the temperature state received from the controller of the patterning device cooling system. According to some embodiments, the controller of the patterning device cooling system may be configured to receive data indicative of patterning device distortion from the lithographic apparatus (e.g., from a controller of the lithographic apparatus). Additionally and/or alternatively, the controller of the patterning device cooling system may be configured to receive data indicative of a temperature of the patterning device from the lithographic apparatus (e.g., a controller of the lithographic apparatus). The controller of the patterning device cooling system may be configured to determine the temperature state of the patterning device based on the data indicative of patterning device distortion and/or the data indicative of the temperature of the patterning device received from the lithographic apparatus. It can be appreciated that a level of patterning device distortion may be correlated with a level of temperature increase such that a temperature of the patterning device may be determined based on the detected distortion.

According to some embodiments, the controller may also determine a production state of the lithographic apparatus, as shown in step 704. As described herein, the production state of the lithographic apparatus may include an overlay focused state, a production focused state, and/or a recipe dependent state. According to some embodiments, the controller may control the conditioning device to condition the patterning device based on the determined temperature state and the production state, as shown in step 706.

According to some embodiments, the temperature state comprises a detected temperature or a predicted temperature of the patterning device. As further described herein, the production state of the lithographic apparatus is a production priority state that optimizes exposure throughput of the patterning device. Alternatively, the production state of the lithographic apparatus is an overlay priority state that prioritizes conditioning the patterning device. According to some embodiments, controller may control the thermal conditioner to determine a conditioning state of the patterning device, and thermally condition the patterning device for exposures based on the temperature state, the production state, and the conditioning state of the patterning device. According to some embodiment a fluid (e.g., water or any other fluid that can be used for cooling) may be conditioned at or near the nominal temperature and runs in a loop to the reticle handler for use to condition reticle temperature. According to some embodiments, the fluid may be passed through the walls of the conditioning device to absorb energy from external heat sources. The fluid may also be used to condition air to the nominal temperature in a series of heat exchangers. According to some embodiments, in addition or alternative to the fluid, air may be passed through, for example, the series of heat exchangers, a filter, a regulator, a valve, and some balancing restrictors to bring the ambient temperature to the nominal temperature +/−0.05° C. when it reaches the patterning device. According to some embodiments, in active conditioning slots, a high flow rate of conditioned air is formed into hundreds of impinging jets that blow downward on the top face of the patterning device to condition it to the nominal temperature within a brief predetermined time period (e.g., <10 minutes). According to some embodiments, in passive conditioning slots, a low flow rate of air passes over the patterning device from back to front (parallel flow) to maintain conditioned state at the nominal temperature and/or condition to the nominal temperature in a different predetermined time period . The different predetermined time period may be longer than the predetermined time period. According to some embodiments, the cooling operation may be controlled by time durations in each type of slot, flow rate of conditioned air, fluid, or any combination/variation of these parameters.

According to some embodiments, the conditioning state is determined when the patterning device is detected at a load port of the lithographic apparatus. According to some embodiments, in response to the conditioning state of the patterning device being a not conditioned state, the controller can control the thermal conditioner to place the patterning device in an active conditioning slot within the thermal conditioner, and change the conditioning state of the patterning device to an active conditioning state. It can be appreciated that the active conditioning slot may rely on air and water cooling methodologies.

According to some embodiments, the conditioning state of the patterning device can be set to a conditioned state when the patterning device reaches a predicted temperature. According to some embodiments, the predicted temperature may be calculated based on a predictive model. Deploying predictive modelling for temperature determination can reduce the need for hardware components within the lithographic apparatus/conditioning apparatus, like reticle temperature sensors and the like. Additionally, the patterning device may be transferred subsequently to a passive conditioning slot within the thermal conditioner when the condition state changes from active conditioning state to a conditioned state.

According to some embodiments, the controller may further control the conditioning device to set the conditioning state of the patterning device to conditioned state in response to the patterning device being placed in the active conditioning state for a predetermined period of time, and transfer the patterning device to a passive conditioning slot within the thermal condition in response the condition state changing from active conditioning state to a conditioned state.

Although specific reference may be made in this text to a "reticle," it should be understood that this is just one example of a patterning device and that the embodiments described herein may be applicable to any type of patterning device. Additionally, the embodiments described herein may be used to provide safety support for any object to ensure a clamping failure does not cause the object to fall and damage either itself or other equipment.

The embodiments may further be described using the following clauses:

1. A patterning device cooling system for thermally conditioning a patterning device of a lithographic apparatus, the cooling system comprising:

a thermal conditioner configured to thermally condition the patterning device; and a controller configured to control the thermal conditioner to:

determine a temperature state of the patterning device, determine a production state of the lithographic apparatus, and thermally condition the patterning device for exposures based on the temperature state and the production state.

2. The cooling system of clause 1, wherein the temperature state comprises a detected temperature or a predicted temperature of the patterning device.

3. The cooling system of clause 2, wherein the production state of the lithographic apparatus is a productivity priority state that prioritizes exposure productivity of the patterning device.

4. The cooling system of clause 2, wherein the production state of the lithographic apparatus is an overlay priority state that prioritizes conditioning of the patterning device over throughput.

5. The cooling system of clause 1, wherein the controller is further configured to control the thermal conditioner to:

determine a conditioning state of the patterning device, and thermally condition the patterning device for exposures based on the temperature state, the production state, and the conditioning state of the patterning device.

6. The cooling system of clause 5, wherein the conditioning state is determined when the patterning device is detected at a load port of the lithographic apparatus.

7. The cooling system of clause 6, wherein, in response to the conditioning state of the patterning device being a not conditioned state, the controller is further configured to control the thermal conditioner to:

place the patterning device in an active conditioning slot within the thermal conditioner, and change the conditioning state of the patterning device to an active conditioning state.

8. The cooling system of clause 7, wherein the active conditioning slot comprises at least one of air and fluid circulation.

9. The cooling system of clause 7 wherein the controller is further configured to control the thermal conditioner to:

set the conditioning state of the patterning device to a conditioned state in response to the patterning device being placed in the active conditioning state for a predetermined period of time; and transfer the patterning device to a passive conditioning slot within the thermal conditioner in response the condition state changing from the active conditioning state to the conditioned state.

10. The cooling system of clause 1, wherein the production state of the lithographic apparatus is a recipe dependent state that changes a priority state of the lithographic apparatus between a productivity priority state that prioritizes exposure productivity of the patterning device and an overlay priority state that prioritizes conditioning of the patterning device.

11. The cooling system of clause 1, wherein the controller is further configured to:

transmit data indicative of the temperature state to the lithographic apparatus; and receive data indicative of patterning device distortion from the lithographic apparatus, wherein the controller is configured to determine the temperature state based on the data indicative of patterning device distortion.

12. The cooling system of clause 1, wherein the controller is further configured to:

transmit data indicative of the temperature state to the lithographic apparatus; and receive data indicative of a temperature of the patterning device from the lithographic apparatus, wherein the controller is configured to determine the temperature state based on the data indicative of the temperature of the patterning device.

13. A method for thermally conditioning a patterning device of a lithographic apparatus, the method comprising:

determining a temperature state of a patterning device;

determining a production state of the lithographic apparatus; and thermally conditioning, by a conditioning device, the patterning device for exposures based on the temperature state and the production state.

14. The method of clause 13, wherein determining the temperature state comprises detecting the temperature or predicting the temperature of the patterning device.

15. The method of clause 14, further comprising:

optimizing exposure throughput of the patterning device in response to the production state of the lithographic apparatus being a production priority state.

16. The method of clause 14, further comprising:

prioritizing conditioning of the patterning device in response to production state of the lithographic apparatus being an overlay priority state.

17. The method of clause 13, further comprising:

determining an conditioning state of the patterning device; and thermally conditioning the patterning device for exposures based on the temperature state, the production state, and the conditioning state of the patterning device.

18. The method of clause 17, further comprising:

determining the conditioning state when the patterning device is detected at a load port of the lithographic apparatus.

19. The method of clause 18, further comprising:

placing the patterning device in an active conditioning slot within a thermal conditioner, and changing the conditioning state of the patterning device to an active conditioning state, in response to the conditioning state of the patterning device being a not conditioned state.

20. The method of clause 18, further comprising:

thermally conditioning the patterning device by at least one of air and fluid circulation.

21. The method of clause 20, further comprising:

setting the conditioning state of the patterning device to a conditioned state in response to the patterning device being placed in the active conditioning state for a predetermined period of time; and transferring the patterning device to a passive conditioning slot within a thermal conditioner in response the condition state changing from the active conditioning state to the conditioned state.

22. The method of clause 20, further comprising:

setting the conditioning state of the patterning device to a conditioned state in response to the patterning device reaching a predicted temperature; and transferring the patterning device to a passive conditioning slot within the thermal conditioner in response the condition state changing from the active conditioning state to the conditioned state.

23. The method of clause 13, further comprising: changing the production state of the lithographic apparatus between a production priority state that prioritizes exposure throughput of the patterning device and an overlay priority state that prioritizes conditioning of the patterning device in response to the production state of the lithographic apparatus being a recipe dependent state.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that the disclosure can be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

The invention claimed is:

1. A patterning device cooling system for thermally conditioning a patterning device of a lithographic apparatus, the cooling system comprising:
   a thermal conditioner configured to thermally condition the patterning device; and
   a controller configured to control the thermal conditioner to:
      determine a temperature state of the patterning device, the temperature state comprising a detected temperature or a predicted temperature of the patterning device,
      determine a production state of the lithographic apparatus, the production state of the lithographic apparatus comprising an overlay priority state that prioritizes conditioning of the patterning device over throughput, and
      the thermally conditioning of the patterning device for exposures based on the temperature state and the production state.

2. The cooling system of claim 1, wherein:
   the production state of the lithographic apparatus further comprises a productivity priority state that prioritizes exposure productivity of the patterning device.

3. The cooling system of claim 1, wherein the production state of the lithographic apparatus is a recipe dependent state that changes a priority state of the lithographic apparatus between a productivity priority state that prioritizes exposure productivity of the patterning device and an overlay priority state that prioritizes conditioning of the patterning device.

4. The cooling system of claim 1, wherein the controller is further configured to:
   transmit data indicative of the temperature state to the lithographic apparatus; and
   receive data indicative of patterning device distortion from the lithographic apparatus, wherein the controller is configured to determine the temperature state based on the data indicative of patterning device distortion.

5. The cooling system of claim 1, wherein the controller is further configured to:

transmit data indicative of the temperature state to the lithographic apparatus; and receive data indicative of a temperature of the patterning device from the lithographic apparatus, wherein the controller is configured to determine the temperature state based on the data indicative of the temperature of the patterning device.

6. A patterning device cooling system for thermally conditioning a patterning device of a lithographic apparatus, the cooling system comprising:

a thermal conditioner configured to thermally condition the patterning device; and a controller configured to control the thermal conditioner to:

determine a temperature state of the patterning device, determine a production state of the lithographic apparatus, determine a conditioning state of the patterning device when the patterning device is detected at a load port of the lithographic apparatus, and thermally condition the patterning device for exposures based on the temperature state, the production state, and the conditioning state of the patterning device.

7. The cooling system of claim 6, wherein, in response to the conditioning state of the patterning device being a not conditioned state, the controller is further configured to control the thermal conditioner to:

place the patterning device in an active conditioning slot within the thermal conditioner, and change the conditioning state of the patterning device to an active conditioning state.

8. The cooling system of claim 7, wherein:

the active conditioning slot comprises at least one of air and fluid circulation; and the controller is further configured to control the thermal conditioner to:

set the conditioning state of the patterning device to a conditioned state in response to the patterning device being placed in the active conditioning state for a predetermined period of time; and transfer the patterning device to a passive conditioning slot within the thermal conditioner in response the condition state changing from the active conditioning state to the conditioned state.

9. A method for thermally conditioning a patterning device of a lithographic apparatus, the method comprising:

determining a temperature state of a patterning device comprising detecting a temperature or a predicting temperature of the patterning device;

determining a production state of the lithographic apparatus;

the thermally conditioning, by a conditioning device, the patterning device for exposures based on the temperature state and the production state;

optimizing exposure throughput of the patterning device in response to the production state of the lithographic apparatus being a production priority state; and prioritizing conditioning of the patterning device in response to the production state of the lithographic apparatus being an overlay priority state.

10. A method for thermally conditioning a patterning device of a lithographic apparatus, the method comprising:

determining a temperature state of a patterning device;

determining a production state of the lithographic apparatus; and determining an conditioning state of the patterning device;

the thermally conditioning of the patterning device for exposures based on the temperature state, the production state, and the conditioning state of the patterning device;

determining the conditioning state when the patterning device is detected at a load port of the lithographic apparatus;

placing the patterning device in an active conditioning slot within a thermal conditioner, and changing the conditioning state of the patterning device to an active conditioning state, in response to the conditioning state of the patterning device being a not conditioned state; and the thermally conditioning of the patterning device by at least one of air and fluid circulation.

11. The method of claim 10, further comprising:

setting the conditioning state of the patterning device to a conditioned state in response to the patterning device being placed in the active conditioning state for a predetermined period of time; and transferring the patterning device to a passive conditioning slot within a thermal conditioner in response the condition state changing from the active conditioning state to the conditioned state.

12. The method of claim 10, further comprising:

setting the conditioning state of the patterning device to a conditioned state in response to the patterning device reaching a predicted temperature; and transferring the patterning device to a passive conditioning slot within the thermal conditioner in response the condition state changing from the active conditioning state to the conditioned state.

13. A method for thermally conditioning a patterning device of a lithographic apparatus, the method comprising:

determining a temperature state of a patterning device;

determining a production state of the lithographic apparatus;

the thermally conditioning, by a conditioning device, the patterning device for exposures based on the temperature state and the production state; and changing the production state of the lithographic apparatus between a production priority state that prioritizes exposure throughput of the patterning device and an overlay priority state that prioritizes conditioning of the patterning device in response to the production state of the lithographic apparatus being a recipe dependent state.

* * * * *